(12) United States Patent
Kreider et al.

(10) Patent No.: US 10,367,480 B1
(45) Date of Patent: Jul. 30, 2019

(54) SYSTEMS AND METHODS FOR GENERATING HIGH PERFORMANCE PULSE WIDTH MODULATION (PWM) SIGNALS

(71) Applicant: HONEYWELL INTERNATIONAL INC., Morris Plains, NJ (US)

(72) Inventors: Thom Kreider, Peoria, AZ (US); Paul D. Kammann, Plymouth, MN (US); Vincent James Gavagan, IV, Peoria, AZ (US)

(73) Assignee: HONEYWELL INTERNATIONAL INC., Morris Plains, NJ (US)

( * ) Notice: Subject to any disclaimer, the term of this patent is extended or adjusted under 35 U.S.C. 154(b) by 0 days.

(21) Appl. No.: 15/918,317

(22) Filed: Mar. 12, 2018

(51) Int. Cl.
*H03K 3/017* (2006.01)
*G06F 1/08* (2006.01)
*H03K 5/24* (2006.01)
*H03K 19/20* (2006.01)
*H03K 21/08* (2006.01)

(52) U.S. Cl.
CPC ............... *H03K 3/017* (2013.01); *G06F 1/08* (2013.01); *H03K 5/24* (2013.01); *H03K 19/20* (2013.01); *H03K 21/08* (2013.01)

(58) Field of Classification Search
CPC .. H03K 19/173; H03K 19/17732; H03K 5/01; H03K 5/06
USPC ................................ 327/172, 173, 174, 175
See application file for complete search history.

(56) References Cited

U.S. PATENT DOCUMENTS

| | | | |
|---|---|---|---|
| 4,165,490 A * | 8/1979 | Howe, Jr. | ................. G06F 1/04 327/172 |
| 4,675,546 A | 6/1987 | Shaw | |
| 6,959,016 B1 | 10/2005 | Keeth et al. | |
| 7,432,752 B1 | 10/2008 | Lee et al. | |
| 8,279,917 B2 | 10/2012 | Takahashi | |
| 9,035,685 B2 | 5/2015 | Kris | |
| 9,337,820 B1 | 5/2016 | Solki et al. | |
| 9,584,105 B1 | 2/2017 | Foley | |
| 2005/0129139 A1* | 6/2005 | Jones | ................. A63B 24/0021 375/295 |
| 2013/0009719 A1 | 1/2013 | Takahashi | |

* cited by examiner

*Primary Examiner* — John W Poos
(74) *Attorney, Agent, or Firm* — Lorenz & Kopf, LLP (57) ABSTRACT

A method for generating a pulse width modulation (PWM) signal, by a processor communicatively coupled to a system memory element, is provided. The method computes, by the processor, a coarse adjustment PWM output signal and a modified fine adjustment input signal, using a low speed clock rate; performs, by the processor, a fine adjustment to the coarse adjustment PWM output signal, using a high speed clock rate, based on the modified fine adjustment input signal; and generates an increased resolution PWM output signal, by the processor, based on the fine adjustment.

17 Claims, 8 Drawing Sheets

SYSTEMS AND METHODS FOR GENERATING HIGH PERFORMANCE PULSE WIDTH MODULATION (PWM) SIGNALS

TECHNICAL FIELD

Embodiments of the subject matter described herein relate generally to generating a pulse width modulation (PWM) signal. More particularly, embodiments of the subject matter relate to modulating a PWM signal to increase resolution.

BACKGROUND

Pulse-width modulation (PWM) is a modulation technique that may be used to allow the control of the power supplied to devices using a pulsing signal. In certain PWM applications, complex and high speed PWM generators are required. Examples may include, but are not limited to: class-D audio applications; direct digital synthesis (DDS) digital-to-analog converters (DACs) for radio frequency (RF) applications; space-vector PWM modulation for motor controls; direct current to direct current (DC/DC) converters; point of load (POL) converters, or the like. For Field Programmable Gate Array (FPGA) and Application Specific Integrated Circuit (ASIC) designs, direct digital synthesis of high-frequency, high-resolution pulse width modulation (PWM) waveforms requires a very high frequency clock domain. However, maximum clock speeds are limited by the complexity of PWM generator logic.

Accordingly, it is desirable to provide increased resolution using typical hardware (e.g., FPGA, ASIC). Furthermore, other desirable features and characteristics will become apparent from the subsequent detailed description and the appended claims, taken in conjunction with the accompanying drawings and the foregoing technical field and background.

BRIEF SUMMARY

Some embodiments of the present disclosure provide a method for generating a pulse width modulation (PWM) signal, by a processor communicatively coupled to a system memory element. The method computes, by the processor, a coarse adjustment PWM output signal and a modified fine adjustment input signal, using a low speed clock rate; performs, by the processor, a fine adjustment to the coarse adjustment PWM output signal, using a high speed clock rate, based on the modified fine adjustment input signal; and generates an increased resolution PWM output signal, by the processor, based on the fine adjustment.

Some embodiments of the present disclosure provide a system for generating a pulse width modulation (PWM) signal. The system includes: a system memory element; a direct digital synthesis (DDS) digital-to-analog converter (DAC); and at least one processor, communicatively coupled to the system memory element and the DDS DAC, the at least one processor configured to: compute a coarse adjustment PWM output signal and a modified fine adjustment input signal, using a low speed clock rate; perform a fine adjustment to the coarse adjustment PWM output signal, using a high speed clock rate, based on the modified fine adjustment input signal; and generate an increased resolution PWM output signal, via the DDS DAC, based on the fine adjustment.

Some embodiments of the present disclosure provide a non-transitory, computer-readable medium containing instructions thereon, which, when executed by a processor, perform a method for generating a pulse width modulation (PWM) signal. The method computes, by the processor, a coarse adjustment PWM output signal and a modified fine adjustment input signal, using a low speed clock rate; performs, by the processor, a fine adjustment to the coarse adjustment PWM output signal, using a high speed clock rate, based on the modified fine adjustment input signal; and generates an increased resolution PWM output signal, by the processor, based on the fine adjustment.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

The subject matter presented herein relates to systems and methods for generating high resolution pulse width modulation (PWM) signals. More specifically, the subject matter relates to increasing the capability of a typical PWM generator by precomputing required data values, using a low clock speed, and then performing a "fine" adjustment to the input data and generating a high resolution PWM output signal, using a high clock speed. Thus, the system performs PWM-specific computations at a low speed, and therefore processes an input data signal of increased bit-width and resolution. The system then adjusts the PWM data using a high speed, and therefore increases the speed and resolution of the PWM output signal. In this way, the resolution of the PWM output signal is not dependent on maximum capabilities of the particular hardware platform implementation of the PWM generator.

Contemplated herein is a system that includes a single-stage PWM generator performance limit. The performance limit is based on the complexity of the logic and the maximum frequency at which the system is capable of executing the logic. Different implementations have different limits based on technology of the system (e.g., the hosting hardware). The limiting frequency sets a cap on resolution, which the system improves by using two stages: (1) a high clock speed stage, and (2) a low clock speed stage. The clock domain frequency for the high clock speed stage is defined by identifying a maximum speed of the high clock speed stage using a manual measurement of the highest frequency at which implementation hardware is capable of performing, wherein the maximum speed is used for the high clock speed stage. The clock domain frequency for the low clock speed stage is calculated using a computation ratio (e.g., 1:2, 1:4, 1:8), as required to meet the user's requirements or limitations of the implementation device. Such an implementation allows for the finest bit of adjustment (i.e., resolution) at the highest PWM frequency the coarse stage can support.

Certain terminologies are used with regard to the various embodiments of the present disclosure. Pulse-width modulation (PWM) is a modulation technique used to allow the control of the power supplied to devices (e.g., motor power control) using a pulsing signal. A high speed, high resolution PWM signal generator clock uses a low speed clock signal and a high speed clock signal, simultaneously, to pre-compute a set of PWM data in the low speed domain and perform a fine adjustment to the pre-computed set of PWM data in the high speed domain. Typical high speed clock signals and low speed clock signals vary, based on applicable implementation hardware, and the high speed clock signal and the low speed clock signal are correlated using an applicable ratio. The ratio of the high speed clock signal to the low speed clock signal is part of the design of the system, and the user-selected implementation may be any power of two, between the fast and slow clock rates (e.g., 1:2, 1:4, 1:8, 1:16).

Figure 1:
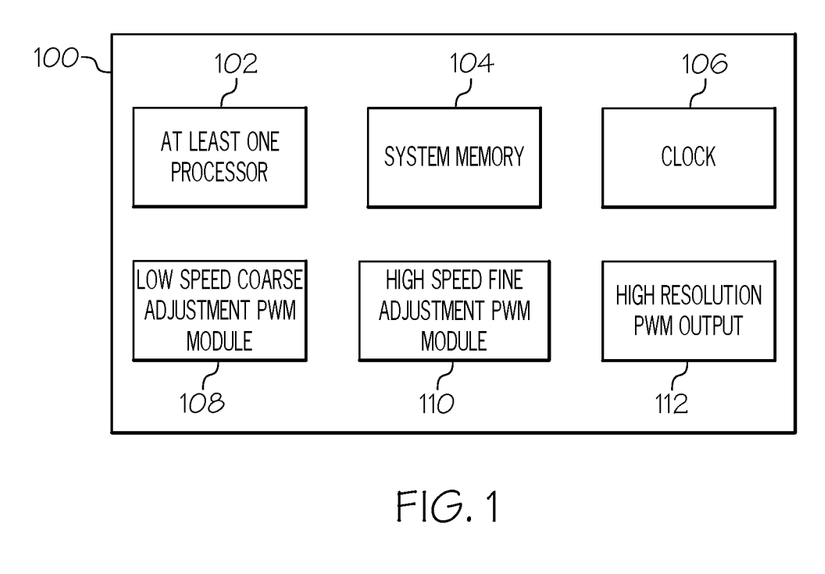
FIG. 1 is a functional block diagram of a high resolution pulse width modulation (PWM) signal generation system, in accordance with the disclosed embodiments.

Turning now to the figures, FIG. 1 is a functional block diagram of a high resolution pulse width modulation (PWM) signal generation system 100, in accordance with the disclosed embodiments. The high resolution PWM signal generation system 100 may be implemented using any desired platform, but will generally be implemented using a Field Programmable Gate Array (FPGA) or an Application Specific Integrated Circuit (ASIC).

The high resolution PWM signal generation system 100 may include, without limitation: at least one processor 102; a system memory 104 element; a clock 106; a low speed coarse adjustment PWM module 108; a high speed fine adjustment PWM module 110; and a high resolution PWM output generator 112. In practice, various embodiments of the high resolution PWM signal generation system 100 may include additional or alternative elements and components, as desired for the particular application. These elements and features of the high resolution PWM signal generation system 100 may be operatively associated with one another, coupled to one another, or otherwise configured to cooperate with one another as needed to support the desired functionality—in particular, providing a high speed, high resolution PWM signal, as described herein. For ease of illustration and clarity, the various physical, electrical, and logical couplings and interconnections for these elements and features are not depicted in FIG. 1. Moreover, it should be appreciated that embodiments of the high resolution PWM signal generation system 100 will include other elements, modules, and features that cooperate to support the desired functionality. For simplicity, FIG. 1 only depicts certain elements that relate to high speed, high resolution PWM signal generation features, described in more detail below.

The at least one processor 102 may be implemented or performed with one or more general purpose processors, a content addressable memory, a digital signal processor, an application specific integrated circuit, a field programmable gate array, any suitable programmable logic device, discrete gate or transistor logic, discrete hardware components, or any combination designed to perform the functions described here. In particular, the at least one processor 102 may be realized as one or more microprocessors, controllers, microcontrollers, or state machines. Moreover, the at least one processor 102 may be implemented as a combination of computing devices, e.g., a combination of digital signal processors and microprocessors, a plurality of microprocessors, one or more microprocessors in conjunction with a digital signal processor core, or any other such configuration.

The at least one processor 102 is communicatively coupled to the system memory 104. The system memory 104 is configured to store any obtained or generated data associated with pulse width modulation (PWM). The system memory 104 may be realized using any number of devices, components, or modules, as appropriate to the embodiment. Moreover, the high resolution PWM signal generation system 100 could include system memory 104 integrated therein and/or a system memory 104 operatively coupled thereto, as appropriate to the particular embodiment. In practice, the system memory 104 could be realized as RAM memory, flash memory, EPROM memory, EEPROM memory, registers, a hard disk, a removable disk, or any other form of storage medium known in the art. In certain embodiments, the system memory 104 includes a hard disk, which may also be used to support functions of the high resolution PWM signal generation system 100. The system memory 104 can be coupled to the at least one processor 102 such that the at least one processor 102 can read information from, and write information to, the system memory 104. In the alternative, the system memory 104 may be integral to the at least one processor 102. As an example, the at least one processor 102 and the system memory 104 may reside in a suitably designed application-specific integrated circuit (ASIC).

The clock 106 is configured to provide both low speed clock signals and high speed clock signals for the high resolution PWM signal generation system 100. Exemplary embodiments of the high resolution PWM signal generation system use a single clock to generate the high speed clock signal and the low speed clock signal synchronously, such that the phase relationship between the high speed clock signal and the low speed clock signal is fixed. However, it should be appreciated that other embodiments of the high resolution PWM signal generation system may use a synchronized, two-clock system configured to generate the high speed clock signal and the low speed clock signal using a fixed phase relationship. Thus, the clock 106 may be implemented using two clocks, wherein a first one of the two clocks provides a high speed clock signal and a second one of the two clocks provides a low speed clock signal. One exemplary embodiment of the clock 106 uses clock frequencies that include 40 MHz and 320 MHz, and 10-bits of resolution wherein there are three "fine" bits and seven "coarse" bits. In this example, there is a 1:8 relationship, wherein 40 MHz×8=320 MHz. The 1:8 ratio corresponds with the number of "fine" bits. That is $2^3$=8. This exemplary relationship indicates that for each "step" in the exemplary 10-bit input, there is a resulting equal increment or decrement in an output pulse width. In other words, the result is the same step change going from "0000000010" (2 decimal) to "0000000011" (3 decimal) as the result from "0000000111" (7 decimal) to "0000001000" (8 decimal). It should be appreciated that both of these examples are a delta of "1", but the latter is a step across the fine to coarse boundary. Further, a value of "0000000001" (decimal 1) represents some finite increment in pulse width. A value of "0001000011" decimal 67) represents that same finite increment multiplied by sixty-seven (67). The clock relationship to the fine/coarse split is what maintains the step size relationship. It should be appreciated that the exemplary embodiment described herein, using the 1:8 ratio, is only one potential implementation. Other embodiments of the clock 106 may use a 1:16 ratio (i.e., $2^4$=16) when the particular application specific integrated circuit (ASIC) or field programmable gate array (FPGA) is capable of running a second clock at a rate of sixteen (16) times the rate of a base clock.

The low speed coarse adjustment PWM module 108 is configured to pre-compute a set of "coarse" data, at a low clock speed (provided by the clock 106), wherein the set of coarse data is pre-computed for use in the high speed clock domain to generate a high resolution PWM output signal. The low speed coarse adjustment PWM module 108 functions to divide an input vector received by the high resolution PWM signal generation system 100. Once divided into two parts, the low speed coarse adjustment PWM module 108 (i) performs typical PWM operations using a first part of the input vector (i.e., a coarse adjustment input signal), and (ii) modifies the second part of the input vector (i.e., a fine adjustment input signal) by translating the second part of the input vector into a set of thermometer code. The pre-computed set of coarse data includes the result of typical PWM operations (i.e., the coarse adjustment PWM output signal) and the thermometer code (i.e., the modified fine adjustment input signal).

The high speed fine adjustment PWM module 110 is configured to use the pre-computed set of coarse data to generate a high resolution PWM output signal, using a high clock speed. The high speed fine adjustment PWM module 110 performs two operations using the pre-computed set of coarse data: (1) a bit shift using the input thermometer code, and (2) a logical operation (e.g., logical OR, logical AND) using the typical PWM operations output (i.e., the coarse adjustment PWM output signal) and the bit-shifted thermometer code. By performing a minimized set of operations using a high clock speed, the high speed fine adjustment PWM module 110 generates a high resolution, high speed PWM output signal.

In practice, the low speed coarse adjustment PWM module 108 and/or the high speed fine adjustment PWM module 110 may be implemented with (or cooperate with) the at least one processor 102 to perform at least some of the functions and operations described in more detail herein. In this regard, the low speed coarse adjustment PWM module 108 and/or the high speed fine adjustment PWM module 110 may be realized as suitably written processing logic, application program code, or the like.

The high resolution PWM output generator 112 is configured to transmit or otherwise provide the high speed, high resolution PWM output signal, from the high speed fine adjustment PWM module 110 to one or more input/output (I/O) devices, ports, and/or other hardware or logic implemented as part of an FPGA and/or ASIC design.

Figure 2A:
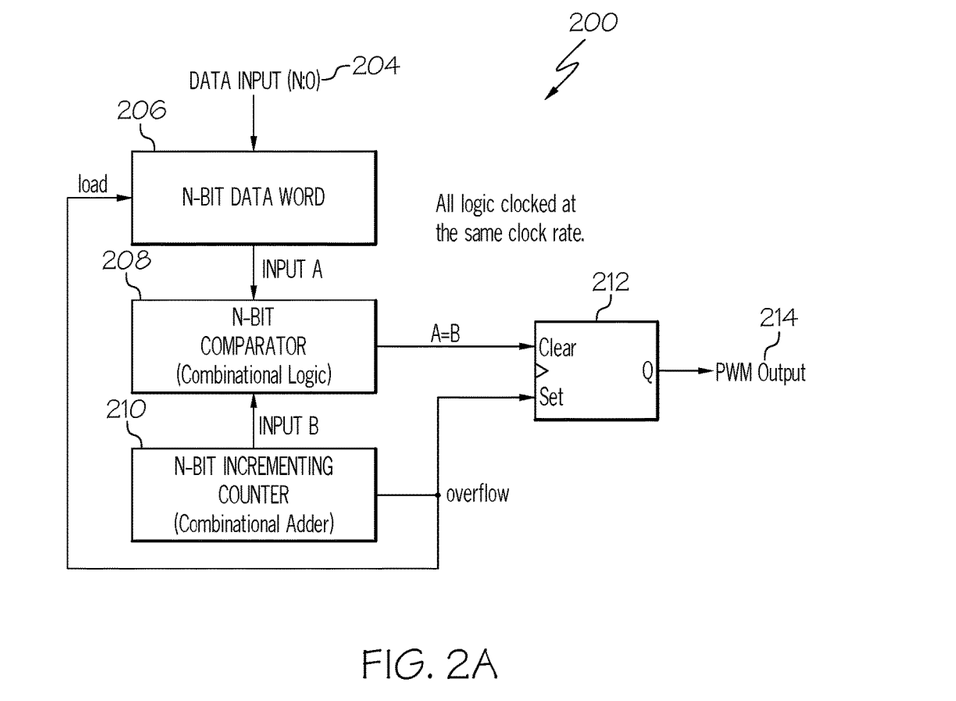
FIGS. 2A-2B are diagrams of a prior art PWM generator and a typical waveform generated by the prior art PWM generator.
Figure 2B:
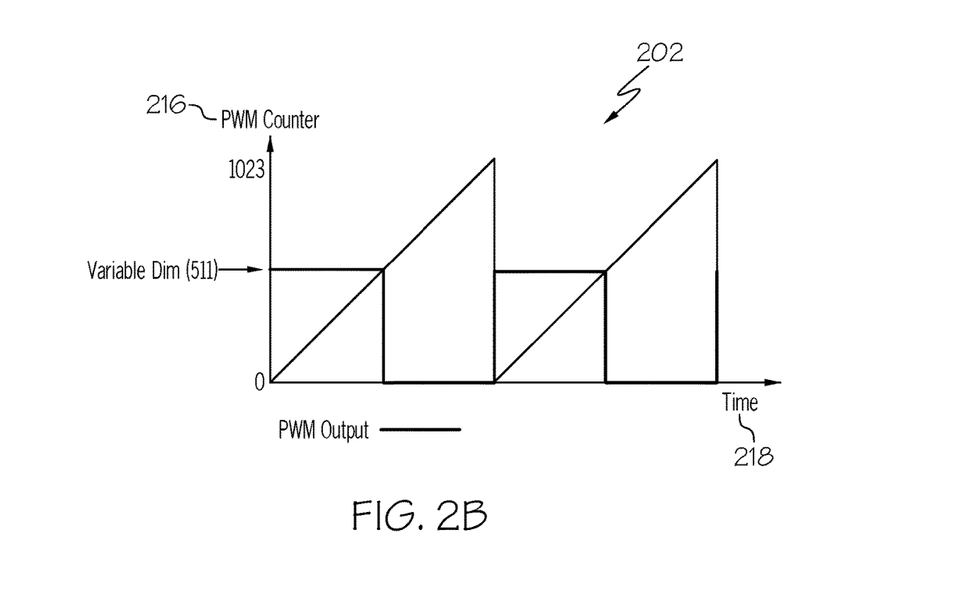

FIGS. 2A-2B are diagrams of a prior art pulse width modulation (PWM) generator 200 and a typical waveform 202 generated by the prior art PWM generator. FIG. 2A illustrates the prior art PWM generator 200 that performs typical PWM operations. A data input signal 204 is received, wherein the data input signal 204 is a variable data-in, N-bit data word (N:0) 206. The prior art PWM generator 200 performs typical PWM operations using the data word (N:0) 206, wherein typical PWM operations include using combinational logic to perform N-bit comparator operations 208 and increment the incrementing counter 210. The result of comparator operations 208 and the incrementing counter 210 operations is used by a flip-flop 212, which produces an output PWM signal 214. A flip-flop 212 is a clocked device, which can change its value only at positive clock edges. When the clock is not at a positive edge, the flip-flop maintains a current, existing value. The comparator operations 208 include comparing the N-bit data word (N:0) 206 to a counter value. When the N-bit data word (N:0) 206 becomes equal to the counter value, then the flip-flop 212 is cleared. When overflow occurs, then the counter is set to one (1).

The combinational logic included in the prior art PWM generator 200 uses a consistent clock rate for the incrementing counter 210 and the flip-flop 212, producing the output PWM signal 214. To perform typical PWM operations using the N-bit data word (N:0) 206, each of the N-bits is compared within a single clock cycle. Thus, the resolution of the N-bit data word (N:0) 206 is limited by the capabilities of the hardware implementation of the prior art PWM generator 200. Increased speed (e.g., faster clock cycles) requires a decreased size of incrementing counter 210 so that the compare logic becomes smaller, therefore sacrificing resolution of the PWM generator 200. Increased resolution (e.g., increased bit-width of the N-bit data word (N:0) 206) requires a decrease in clock frequency, due to the increased amount of combinational logic operations that are performed in one clock cycle.

FIG. 2B illustrates a typical waveform 202 generated by the prior art PWM generator 200 of FIG. 2A. Time values 218 are presented along the x-axis, and PWM counter values 216 are presented along the y-axis. As shown, the typical waveform 202 includes a sawtooth pattern provided by the incrementing counter 210 that increments each clock cycle until reaching a maximum value associated with resolution of the PWM generator 200.

Figure 3:
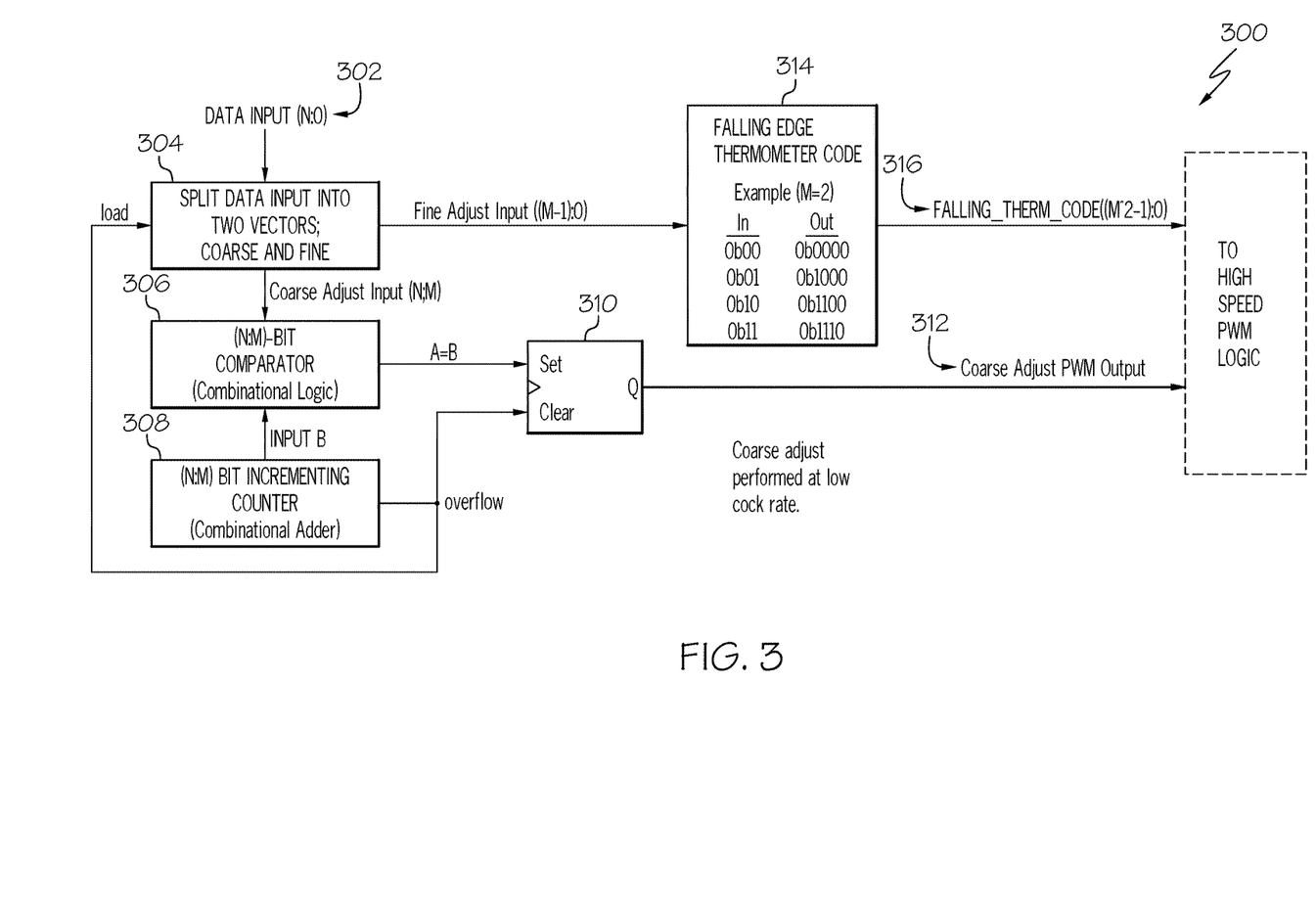
FIG. 3 is a diagram of a low speed aspect of a high resolution PWM signal generation system, in accordance with the disclosed embodiments.

FIG. 3 is a diagram of a low speed aspect 300 of a high resolution PWM signal generation system, in accordance with the disclosed embodiments. It should be noted that the low speed aspect 300 can be implemented with the low speed coarse adjustment PWM module 108 depicted in FIG. 1. In this regard, the low speed aspect 300 shows certain elements and components of the low speed coarse adjustment PWM module 108 in more detail. It should be appreciated that comparator 306, the incrementing counter 308, and the thermometer code generator 314, and any corresponding logical elements, individually or in combination, are exemplary means for performing a claimed function. In practice, an embodiment of the low speed aspect 300 of a high resolution PWM signal generation system may include additional or alternative elements and components, as desired for the particular application. For example, additional components to perform combinational logic operations (e.g., look up tables (LUTs), flip-flops, multiplexers) may be employed without departing from the scope of the present disclosure.

A data input signal 302 is received, wherein the data input signal 302 is an N-bit data word (N:0). The low speed aspect 300 of the high resolution PWM signal generation system splits 304 (i.e., divides) the data input signal 302 into two vectors: a coarse adjust input signal (N:M) and fine adjust input signal ((M−1):0). The coarse adjust input signal (N:M) includes bits N to M, wherein N is the first bit of the data word (N:0), and wherein M is any other bit of the data word at which the data word (N:0) is divided. Generally, the location of the division is dependent on the ratio of the slow and fast clock domains (described previously with regard to FIG. 1), wherein M is the power-of-two ratio between the fast and slow clock domains. The fine adjust input signal ((M−1):0) includes bits M−1 to the end of the data word (N:0).

The low speed aspect 300 performs typical PWM operations using the coarse adjust input signal (N:M), wherein typical PWM operations include using combinational logic to perform comparator operations 306 and increment the incrementing counter 308. The typical PWM operations are described previously with regard to FIGS. 2A-2B, and will not be redundantly described here. The result of comparator 306 operations and the incrementing counter 308 operations is the coarse adjust PWM output 312, which is later used by the high speed PWM logic aspect to produce a high resolution, high speed PWM output signal (see FIG. 4).

When the data input signal 302 (i.e., the data word (N:0)) is split 304 into two vectors, the fine adjust input signal ((M−1):0) is then translated 314 (i.e., modified) into thermometer code 316. The thermometer code 316 is an increasing serial representation of binary ones (1s). Once translated, the thermometer code 316 is later used by the high speed PWM logic aspect to produce a high resolution, high speed PWM output signal (see FIG. 4). The thermometer code 316 is a pre-computed value that gets loaded into the high speed clock domain shift register, wherein the bit width of the thermometer code 316 represents the additional resolution gained from the high speed clock domain. For examples using a falling edge thermometer code, with a width of two raised to the power of M (i.e., $2^M$), the binary value of ((M−1):0) is left justified by a defined number of ones (e.g., $2^M$ ones) in the output thermometer code word. This is a simple lookup table or decode block. For examples using a rising edge thermometer code, the number of ones is instead right justified. It should be appreciated that adjustments may be made to the falling edge signal, the rising edge signal, or both edges, based on the applicable embodiment.

Thus, the coarse adjust PWM output 312 and the thermometer code 316 constitute a pre-computed set of coarse data for later use. The low speed aspect 300 performs computations using a data input signal 302 that includes a larger bit width than the implementation hardware can use to generate a PWM output signal. The low speed aspect 300 performs the necessary computations for a data input signal 302 of higher resolution, such that the high speed aspect (shown in FIG. 4) is capable of performing minimal operations at a high clock speed and therefore generates a high resolution and high speed PWM output signal.

Figure 4:
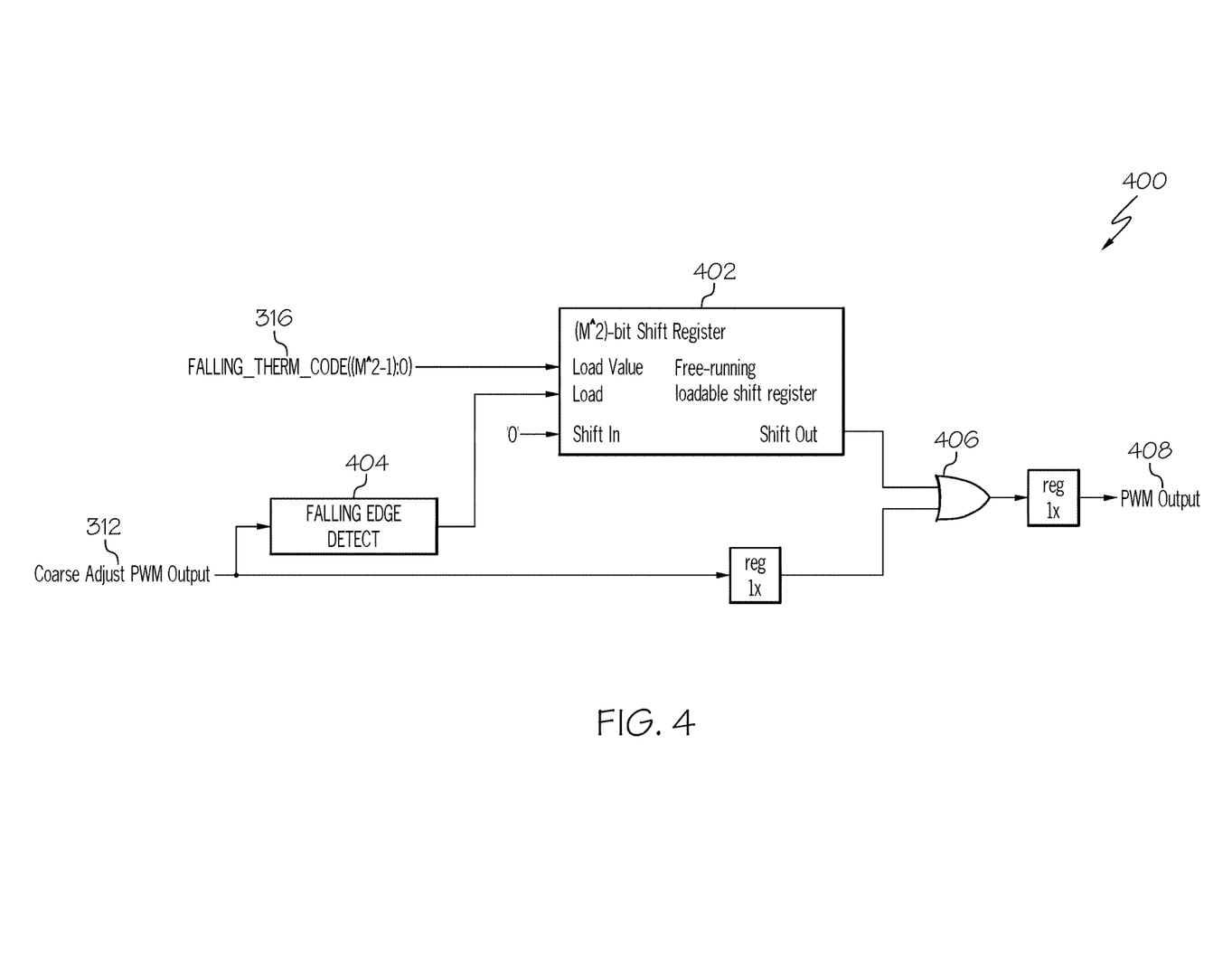
FIG. 4 is a diagram of a high speed aspect of a high resolution PWM signal generation system, in accordance with the disclosed embodiments.

FIG. 4 is a diagram of a high speed aspect 400 of a high resolution PWM signal generation system, in accordance with the disclosed embodiments. It should be noted that the high speed aspect 400 can be implemented with the high speed fine adjustment PWM module 110 depicted in FIG. 1. In this regard, the high speed aspect 400 shows certain elements and components of the high speed fine adjustment PWM module 110 in more detail. It should be appreciated that shift register 402, the logical OR gate 406, and any corresponding logical elements, individually or in combination, are exemplary means for performing a claimed function. In practice, an embodiment of the high speed aspect 400 of a high resolution PWM signal generation system may include additional or alternative elements and components, as desired for the particular application. For example, additional components to perform combinational logic operations (e.g., look up tables (LUTs), flip-flops, multiplexers) may be employed without departing from the scope of the present disclosure.

The high speed aspect 400 receives the coarse adjust PWM output 312 and the modified fine adjust input signal 316 as data inputs. The high speed aspect 400 performs a falling edge detection 404 using the coarse adjust PWM output 312. For a falling edge PWM, the output of the falling edge detection 404 is used. The output of the falling edge detection 404 is a single clock pulse signal used to load the shift register with the precomputed falling edge thermometer code value. For a rising edge PWM, there would be a rising edge detect block (not shown) that creates a rising edge pulse on the coarse adjust PWM signal. A rising/falling edge detector is created from a single flip flop and one 2-input combinational gate, resulting in a fast speed for use in the high speed clock domain. The high speed aspect 400 uses the modified fine adjust input signal 316 and the output of the falling edge detection 404 as input to a shift register 402. Here, the high speed aspect 400 performs a bit-shift of the modified fine adjust input signal 316. The output of the shift register 402 is the bit-shifted fine adjust signal. The high speed aspect 400 then performs a logical operation (e.g., logical OR 406) using the coarse adjust PWM output 312 and the bit-shifted fine adjust signal, to generate the high speed, high resolution PWM output signal 408.

The high speed aspect 400 is required to use minimal combinational logic in order to operate at a high speed clock rate. As shown, the high speed aspect 400 of the high resolution PWM signal generation system receives two pre-computed input signals from the low speed aspect (see FIG. 3), such that the high speed aspect 400 is capable of performing minimal operations at a high clock speed to produce a high speed, high resolution PWM output signal.

Figure 5:
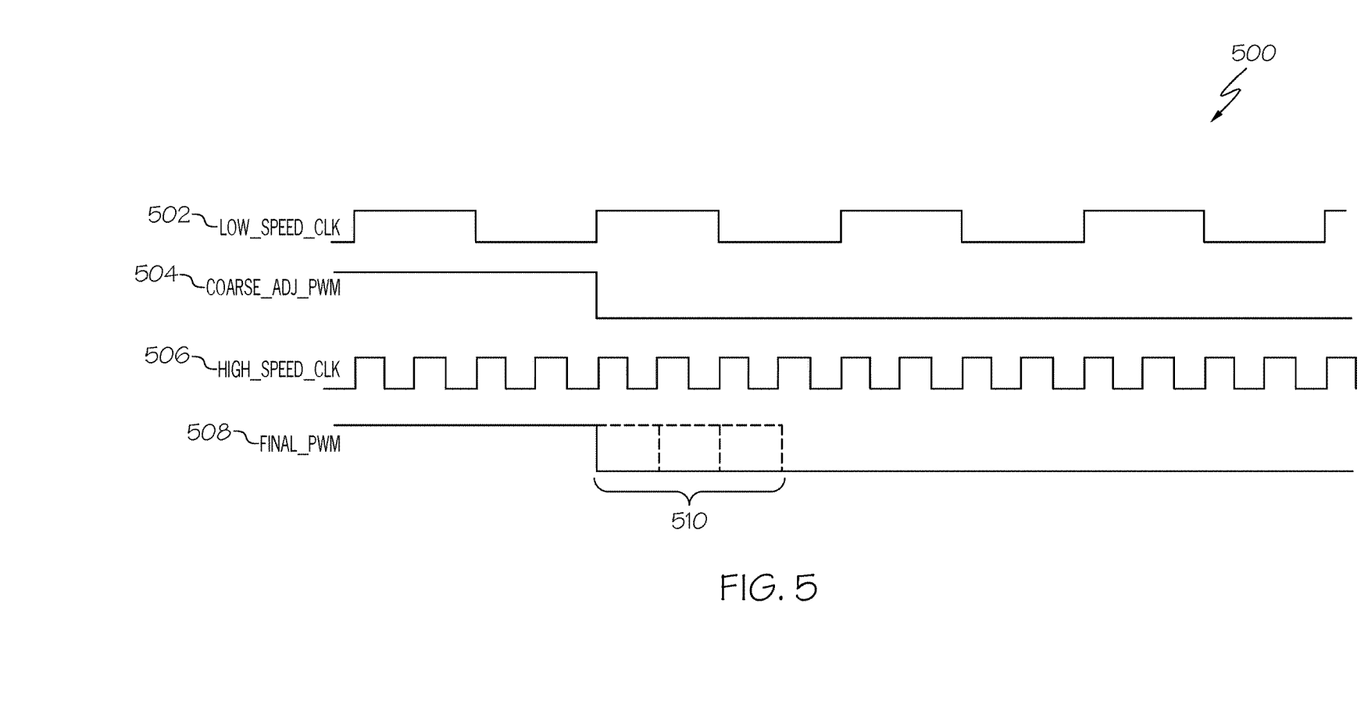
FIG. 5 is a plot diagram of typical waveforms generated by a high resolution PWM signal generation system, in accordance with the disclosed embodiments.

FIG. 5 is a plot 500 diagram of typical waveforms generated by a high resolution PWM signal generation system, in accordance with the disclosed embodiments. The high speed clock signal 506 may be implemented using any clock generating a signal defined by identifying a maximum speed of the high clock speed stage using a manual measurement of the highest frequency at which implementation hardware is capable of performing, wherein the maximum speed is used for the high clock speed stage. The low speed clock signal 502 may be implemented using any clock generating a signal calculated using a computation ratio (e.g., 1:2, 1:4, 1:8, 1:16) of the low clock speed versus the high clock speed, as required to meet the user's requirements or limitations of the implementation device. Thus, the low speed clock signal 502 is based on a "power of two" multiple of the high speed clock signal 506. The coarse adjust pulse width modulation (PWM) signal 504 is produced by a typical PWM generator that performs typical PWM operations (e.g., comparator operations, incrementing counter operations), as described with regard to FIGS. 2A-2B.

The high speed, high resolution PWM output signal 508 includes increased resolution 510 in the form of extended falling edges. In this way, the coarse adjust PWM signal 504 is extended to increase the resolution. The high resolution PWM signal generation system combines the use of high resolution operations performed in the low speed clock domain, and the use of high speed operations performed in the high speed clock domain, in order to generate a high speed, high resolution PWM output signal. The high resolution PWM signal generation system increases resolution of a typical PWM output signal (e.g., a PWM output signal generated by typical PWM operations, as described with regard to FIGS. 2A-2B) by extending the falling edges of the output pulses (e.g., the increased resolution 510), or by extending the rising edges of the output pulses.

As described previously with regard to FIG. 1, exemplary embodiments of the high resolution PWM signal generation system use a single clock to generate the high speed clock signal and the low speed clock signal synchronously, such that the phase relationship between the high speed clock signal 506 and the low speed clock signal 502 is fixed. However, it should be appreciated that other embodiments of the high resolution PWM signal generation system may use a synchronized, two-clock system configured to generate the high speed clock signal 506 and the low speed clock signal 502 using a fixed phase relationship.

Figure 6:
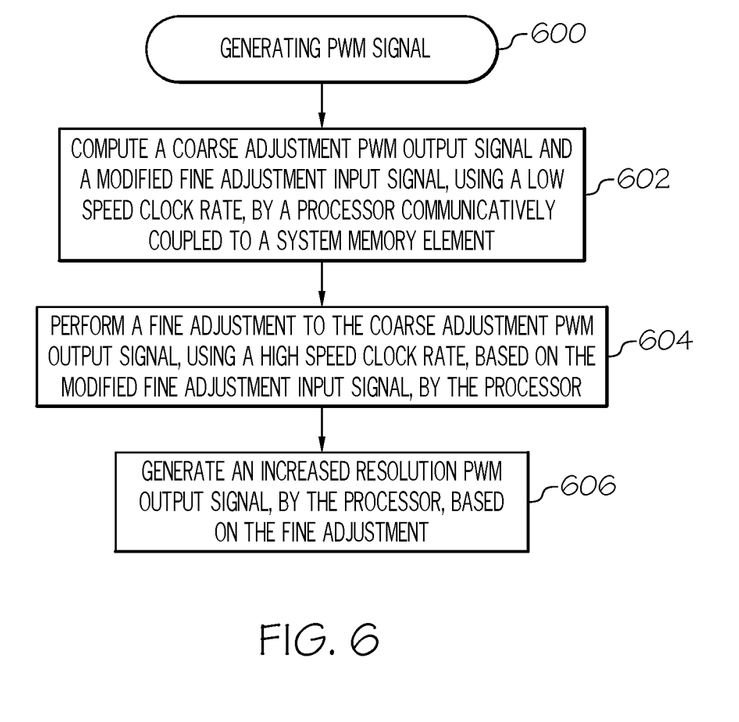
FIG. 6 is a flow chart that illustrates an embodiment of a process for generating a high resolution PWM signal, in accordance with the disclosed embodiments.

FIG. 6 is a flow chart that illustrates an embodiment of a process 600 for generating a high resolution PWM signal, in accordance with the disclosed embodiments. First, the process 600 computes a coarse adjustment PWM output signal and a modified fine adjustment input signal, using a low speed clock rate, by a processor communicatively coupled to a system memory element (step 602). One suitable methodology for computing a coarse adjustment PWM output signal and a modified fine adjustment input signal, using a low speed clock rate, is described below with reference to FIG. 7. Here, the process 600 pre-computes a set of data (e.g., the coarse adjustment PWM output signal, the modified fine adjustment input signal) for later use. The process 600 uses the low speed clock signal to enable the implementation hardware (e.g., an FPGA, ASIC, or the like) to perform computations using data values that include a higher bit width, resulting in the generation of a higher-resolution PWM output signal. During later use, and using a high speed clock signal, the pre-computed set of data is used to generate a high speed, high resolution PWM output signal.

Next, the process 600 performs a fine adjustment to the coarse adjustment PWM output signal using a high speed clock rate, based on the modified fine adjustment input signal, by the processor (step 604). One suitable methodology for performing a fine adjustment to the coarse adjustment PWM output signal, using a high speed clock rate, is described below with reference to FIG. 8. In order to operate using a high clock speed, the process 600 performs minimal combinational logic operations. Minimal combinational logic operations is determined by the clock ratio M (described previously with regard to FIG. 3). The higher the clock ratio M, the less combinational logic permitted by the process 600. Exemplary embodiments of the process 600 use two-input combinational logic gates in the high speed clock domain. A higher clock ratio M indicates a higher clock rate in the high-speed domain. At the frequency increases, it becomes more difficult to close timing. Thus, less logic is permitted in order to close timing.

The process 600 then generates an increased resolution PWM output signal, by the processor, based on the fine adjustment (step 606). In some embodiments, the process 600 adjusts falling edges of pulses of an original PWM output signal, using the coarse adjustment PWM output signal, the modified fine adjustment input signal, and the fine adjustment, to create adjusted falling edges; wherein the increased resolution PWM output signal includes the adjusted falling edges. In some embodiments, the process 600 adjust rising edges of pulses of an original PWM output signal, using the coarse adjustment PWM output signal, the modified fine adjustment input signal, and the fine adjustment, to create adjusted rising edges; wherein the increased resolution PWM output signal includes the adjusted rising edges.

The process 600 combines the use of high resolution operations performed in the low speed clock domain, and the use of high speed operations performed in the high speed clock domain, in order to generate a high speed, high resolution PWM output signal. The process 600 increases resolution of a typical PWM output signal (e.g., a PWM output signal generated by typical PWM operations, as described with regard to FIGS. 2A-2B) by extending the falling edges of the output pulses, or by extending the rising edges of the output pulses.

Figure 7:
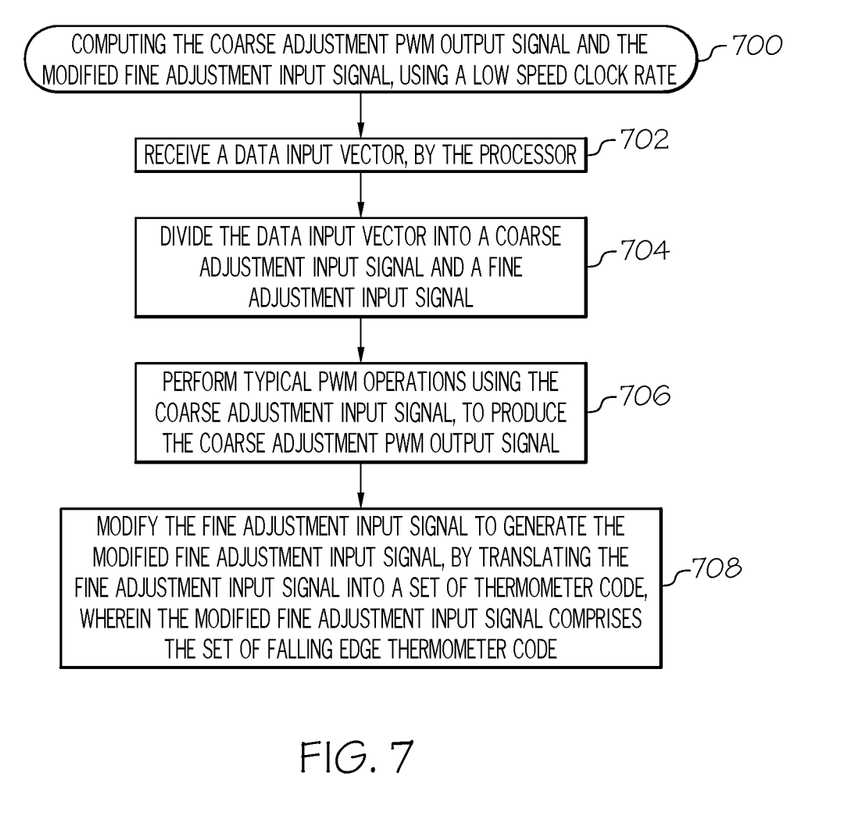
FIG. 7 is a flow chart that illustrates an embodiment of a process for computing a coarse adjustment PWM output signal and a modified fine adjustment input signal, using a low speed clock rate, in accordance with the disclosed embodiments.

FIG. 7 is a flow chart that illustrates an embodiment of a process 700 for computing a coarse adjustment PWM output signal and a modified fine adjustment input signal, using a low speed clock rate, in accordance with the disclosed embodiments. It should be appreciated that the process 700 described in FIG. 7 represents one embodiment of step 602 described above in the discussion of FIG. 6, including additional detail. First, the process 700 receives a data input vector, by the processor (step 702). The data input vector is the typical input signal to a PWM generator, and includes an N-bit data word (N:0) that includes a bit-width appropriate to a low clock speed. The data input vector is received, wherein the data input vector is an N-bit data word (N:0), as described previously with regard to FIG. 3.

Next, the process 700 divides the data input vector into a coarse adjustment input signal and a fine adjustment input signal (step 704). Here, the process divides the N-bit data word (N:0) into two vectors: a coarse adjustment input signal (N:M) and fine adjustment input signal ((M−1):0). The coarse adjustment input signal (N:M) includes bits N to M, wherein N is the first bit of the data word (N:0), and wherein M is any other bit of the data word at which the data word (N:0) is divided. The fine adjustment input signal ((M−1):0) includes bits M−1 to the end of the data word (N:0). The process 700, as part of the low speed aspect of the high resolution PWM signal generation system, splits (i.e., divides) the data input signal (i.e., data input vector) into two vectors: a coarse adjust input signal (N:M) and fine adjust input signal ((M−1):0). The coarse adjust input signal (N:M) includes bits N to M, wherein N is the first bit of the data word (N:0), and wherein M is any other bit of the data word at which the data word (N:0) is divided. Generally, the location of the division is dependent on the ratio of the slow and fast clock domains (described previously with regard to FIG. 1), wherein M is the power-of-two ratio between the fast and slow clock domains. The fine adjust input signal ((M−1):0) includes bits M−1 to the end of the data word (N:0).

The process 700 then performs typical PWM operations using the coarse adjustment input signal, to produce the coarse adjustment PWM output signal (step 706). Typical PWM operations include performing comparator operations and incrementing counter operations (as described previously with regard to FIGS. 2A-2B), using the coarse adjustment input signal. The result of the typical PWM operations is the coarse adjustment PWM output signal. The low speed aspect performs typical PWM operations using the coarse adjust input signal (N:M), wherein typical PWM operations include using combinational logic to perform comparator operations and increment the incrementing counter. The result of comparator operations and the incrementing counter operations is the coarse adjust PWM output, which is later used by the high speed PWM logic aspect to produce a high resolution, high speed PWM output signal.

The process 700 also modifies the fine adjustment input signal to generate the modified fine adjustment input signal, by translating the fine adjustment input signal into a set of thermometer code, wherein the modified fine adjustment input signal comprises the set of thermometer code (step 708). When the data input signal (i.e., the N-bit data word (N:0)) is split into two vectors, the fine adjust input signal ((M−1):0) is then translated or modified into thermometer code. The thermometer code is an increasing serial representation of binary ones (1s), wherein a falling edge thermometer code is a left justified increasing serial representation of binary ones (1s) and a rising edge thermometer code is a right justified increasing serial representation of binary ones (1s).

In some embodiment of the process 700, the set of thermometer code may include a set of falling edge thermometer code used to modify the falling edge of the PWM output signal to increase resolution of the PWM output signal. In some embodiment of the process 700, the set of thermometer code may include a set of rising edge thermometer code used to modify the rising edge of the PWM output signal to increase resolution of the PWM output signal. Once translated, the thermometer code is later used by the high speed PWM logic aspect to produce a high resolution, high speed PWM output signal.

The process 700 uses a low speed clock signal to pre-compute a set of coarse data for later use, wherein the pre-computed set of coarse data includes the coarse adjust PWM output and the thermometer code. The low speed clock signal is calculated using a computation ratio (e.g., 1:2, 1:4, 1:8, 1:16) of the low clock speed versus the high clock speed, based on the high speed clock signal indicated by limitations of the implementation hardware. Here, the high speed clock signal is defined by identifying a maximum speed of the high clock speed stage using a manual measurement of the highest frequency at which implementation hardware is capable of performing, wherein the maximum speed is used for the high clock speed stage.

The thermometer code is an increasing serial representation of binary ones (1s). The thermometer code is a pre-computed value that gets loaded into the high speed clock domain shift register, wherein the bit width of the thermometer code represents the additional resolution gained from the high speed clock domain. For examples using a falling edge thermometer code, with a width of two raised to the power of M (i.e., $2^M$), the binary value of ((M−1):0) is left justified by a defined number of ones (e.g., $2^M$ ones) in the output thermometer code word. This is a simple lookup table or decode block. For examples using a rising edge thermometer code, the number of ones is instead right justified. It should be appreciated that adjustments may be made to the falling edge signal, the rising edge signal, or both edges, based on the applicable embodiment.

The process 700 performs computations using a data input signal that includes a larger bit width than the implementation hardware can use to generate a PWM output signal. The process 700 performs the necessary computations for a data input signal (i.e., N-bit data word (N:0)) of higher resolution, such that the high speed aspect is capable of performing minimal operations at a high clock speed and therefore generates a high resolution and high speed PWM output signal.

Figure 8:
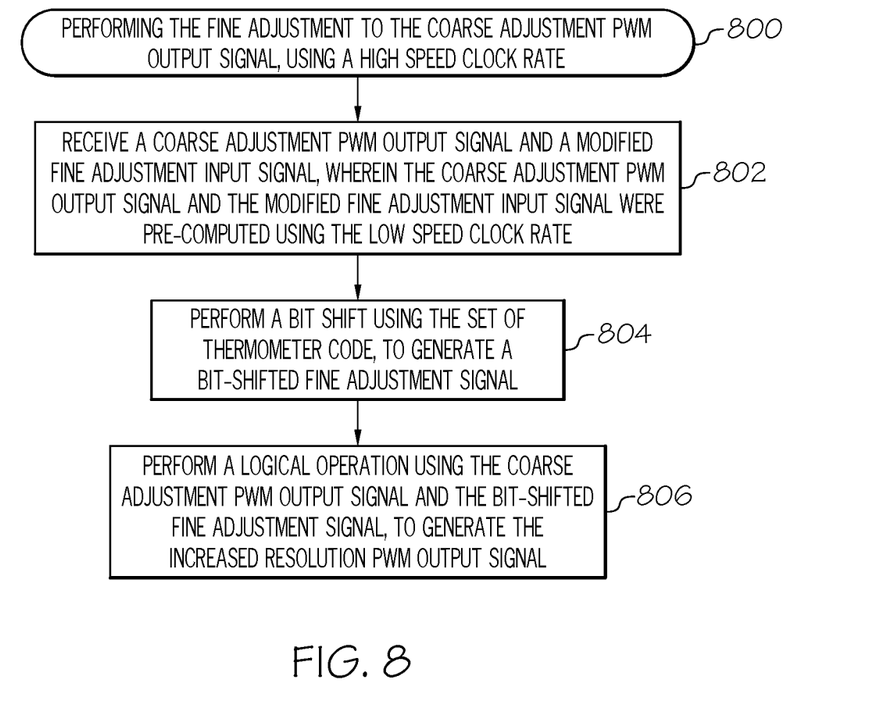
FIG. 8 is a flow chart that illustrates an embodiment of a process for performing a fine adjustment to the coarse adjustment PWM output signal, using a high speed clock rate, in accordance with the disclosed embodiments.

FIG. 8 is a flow chart that illustrates an embodiment of a process 800 for performing a fine adjustment to the coarse adjustment PWM output signal, using a high speed clock rate, in accordance with the disclosed embodiments. It should be appreciated that the process 800 described in FIG. 8 represents one embodiment of step 604 described above in the discussion of FIG. 6, including additional detail.

First, the process 800 receives the coarse adjustment PWM output signal and the modified fine adjustment input signal, wherein the coarse adjustment PWM output signal and the modified fine adjustment input signal were pre-computed using a low speed clock rate (step 802). Here, the process 800 receives: (1) the coarse adjust PWM output, and (2) the modified fine adjust input signal as data inputs. The process 800 performs a falling edge detection using the coarse adjust PWM output. The process 800, as part of the high speed aspect of the system, receives the coarse adjust PWM output and the modified fine adjust input signal as data inputs. The high speed aspect performs a falling edge detection using the coarse adjust PWM output. For a falling edge PWM, the output of the falling edge detection is used. The output of the falling edge detection is a single clock pulse signal used to load the shift register with the precomputed falling edge thermometer code value. For a rising edge PWM, there would be a rising edge detect block (not shown) that creates a rising edge pulse on the coarse adjust PWM signal. A rising/falling edge detector is created from a single flip flop and one 2-input combinational gate, resulting in a fast speed for use in the high speed clock domain.

The process 800 performs a bit-shift using the set of thermometer code, to generate a bit-shifted fine adjustment signal (step 804). In some embodiments, the bit-shift is a left shift, and in some embodiments the bit-shift is a right shift. The process 800 generally performs the bit-shift using a shift register. The process 800 uses the modified fine adjust input signal and the output of the falling edge detection as input to the shift register. Here, the process 800 performs a bit-shift of the modified fine adjust input signal (i.e., the thermometer code).

Next, the process 800 performs a logical operation using the coarse adjustment PWM output signal and the bit-shifted fine adjustment signal, to generate the increased resolution PWM output signal (step 806). In some embodiments, the logical operation is a logical OR operation. In other embodiments, the process 800 uses a logical AND operation. The output of the shift register is the bit-shifted fine adjust signal. The process 800 then performs a logical operation (e.g., logical OR, logical AND) using the coarse adjust PWM output and the bit-shifted fine adjust signal, to generate the high speed, high resolution PWM output signal. The process 800 is required to use minimal combinational logic in order to operate at a high speed clock rate. The high speed clock signal is a maximum speed of the high clock speed stage using a manual measurement of the highest frequency at which implementation hardware is capable of performing, wherein the maximum speed is used for the high clock speed stage. The process 800 receives two pre-computed input signals from the low speed aspect, such that the process 800 is capable of performing minimal operations at a high clock speed to produce a high speed, high resolution PWM output signal.

The various tasks performed in connection with processes 600-800 may be performed by software, hardware, firmware, or any combination thereof. For illustrative purposes, the preceding descriptions of processes 600-800 may refer to elements mentioned above in connection with FIGS. 1-5. In practice, portions of processes 600-800 may be performed by different elements of the described system. It should be appreciated that processes 600-800 may include any number of additional or alternative tasks, the tasks shown in FIGS. 6-8 need not be performed in the illustrated order, and processes 600-800 may be incorporated into a more comprehensive procedure or process having additional functionality not described in detail herein. Moreover, one or more of the tasks shown in FIGS. 6-8 could be omitted from embodiments of the processes 600-800 as long as the intended overall functionality remains intact.

Techniques and technologies may be described herein in terms of functional and/or logical block components, and with reference to symbolic representations of operations, processing tasks, and functions that may be performed by various computing components or devices. Such operations, tasks, and functions are sometimes referred to as being computer-executed, computerized, software-implemented, or computer-implemented. In practice, one or more processor devices can carry out the described operations, tasks, and functions by manipulating electrical signals representing data bits at memory locations in the system memory, as well as other processing of signals. The memory locations where data bits are maintained are physical locations that have particular electrical, magnetic, optical, or organic properties corresponding to the data bits. It should be appreciated that the various block components shown in the figures may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

When implemented in software or firmware, various elements of the systems described herein are essentially the code segments or instructions that perform the various tasks. The program or code segments can be stored in a processor-readable medium or transmitted by a computer data signal embodied in a carrier wave over a transmission medium or communication path. The "computer-readable medium", "processor-readable medium", or "machine-readable medium" may include any medium that can store or transfer information. Examples of the processor-readable medium include an electronic circuit, a semiconductor memory device, a ROM, a flash memory, an erasable ROM (EROM), a floppy diskette, a CD-ROM, an optical disk, a hard disk, a fiber optic medium, a radio frequency (RF) link, or the like. The computer data signal may include any signal that can propagate over a transmission medium such as electronic network channels, optical fibers, air, electromagnetic paths, or RF links. The code segments may be downloaded via computer networks such as the Internet, an intranet, a LAN, or the like.

The preceding description refers to elements or nodes or features being "connected" or "coupled" together. As used herein, unless expressly stated otherwise, "coupled" means that one element/node/feature is directly or indirectly joined to (or directly or indirectly communicates with) another element/node/feature, and not necessarily mechanically. Likewise, unless expressly stated otherwise, "connected" means that one element/node/feature is directly joined to (or directly communicates with) another element/node/feature, and not necessarily mechanically. Thus, although the schematic shown in FIG. 1 depicts one exemplary arrangement of elements, additional intervening elements, devices, features, or components may be present in an embodiment of the depicted subject matter.

For the sake of brevity, conventional techniques related to signal processing, data transmission, signaling, network control, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

Some of the functional units described in this specification have been referred to as "modules" in order to more particularly emphasize their implementation independence. For example, functionality referred to herein as a module may be implemented wholly, or partially, as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like. Modules may also be implemented in software for execution by various types of processors. An identified module of executable code may, for instance, comprise one or more physical or logical modules of computer instructions that may, for instance, be organized as an object, procedure, or function. Nevertheless, the executables of an identified module need not be physically located together, but may comprise disparate instructions stored in different locations that, when joined logically together, comprise the module and achieve the stated purpose for the module. Indeed, a module of executable code may be a single instruction, or many instructions, and may even be distributed over several different code segments, among different programs, and across several memory devices. Similarly, operational data may be embodied in any suitable form and organized within any suitable type of data structure. The operational data may be collected as a single data set, or may be distributed over different locations including over different storage devices, and may exist, at least partially, merely as electronic signals on a system or network.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for generating a pulse width modulation (PWM) signal, by a processor communicatively coupled to a system memory element, the method comprising:
computing, by the processor, a coarse adjustment PWM output signal and a modified fine adjustment input signal, using a low speed clock rate, by:
receiving a data input vector, by the processor;
dividing the data input vector into a coarse adjustment input signal and a fine adjustment input signal; and
performing comparator operations and incrementing counter operations using the coarse adjustment input signal, to produce the coarse adjustment PWM output signal; and
performing, by the processor, a fine adjustment to the coarse adjustment PWM output signal, using a high speed clock rate, based on the modified fine adjustment input signal; and
generating an increased resolution PWM output signal, by the processor, based on the fine adjustment.

2. The method of claim 1, wherein computing the coarse adjustment PWM output signal and the modified fine adjustment input signal, using a low speed clock rate, further comprises:
modifying the fine adjustment input signal to generate the modified fine adjustment input signal, by translating the fine adjustment input signal into a set of falling edge thermometer code comprising an increasing serial representation of ones (1s), wherein the modified fine adjustment input signal comprises the set of falling edge thermometer code.

3. The method of claim 1, wherein computing the coarse adjustment PWM output signal and the modified fine adjustment input signal, using a low speed clock rate, further comprises:
modifying the fine adjustment input signal to generate the modified fine adjustment input signal, by translating the fine adjustment input signal into a set of rising edge thermometer code comprising an increasing serial representation of ones (1s), wherein the modified fine adjustment input signal comprises the set of rising edge thermometer code.

4. The method of claim 1, wherein performing the fine adjustment to the coarse adjustment PWM output signal, using a high speed clock rate, based on the modified fine adjustment input signal, further comprises:
receiving the coarse adjustment PWM output signal and the modified fine adjustment input signal, wherein the coarse adjustment PWM output signal and the modified fine adjustment input signal were pre-computed using the low speed clock rate;
shifting one bit of the fine adjustment input signal by performing a logical right shift, to generate a bit-shifted fine adjustment signal; and
performing a logical OR operation using the coarse adjustment PWM output signal and the bit-shifted fine adjustment signal, to generate the increased resolution PWM output signal.

5. The method of claim 1, wherein performing the fine adjustment to the coarse adjustment PWM output signal, using a high speed clock rate, based on the modified fine adjustment input signal, further comprises:
receiving the coarse adjustment PWM output signal and the modified fine adjustment input signal, wherein the coarse adjustment PWM output signal and the modified fine adjustment input signal were pre-computed using the low speed clock rate;
shifting one bit of the fine adjustment input signal by performing a logical left shift, to generate a bit-shifted fine adjustment signal; and
performing a logical OR operation using the coarse adjustment PWM output signal and the bit-shifted fine adjustment signal, to generate the increased resolution PWM output signal.

6. The method of claim 1, wherein computing the coarse adjustment PWM output signal and the modified fine adjustment input signal, using a low speed clock rate, further comprises:
performing typical PWM generator operations using the coarse adjustment input signal, to produce the coarse adjustment PWM output signal;
modifying the fine adjustment input signal to generate the modified fine adjustment input signal, by translating the fine adjustment input signal into a set of thermometer code comprising an increasing serial representation of ones (1s), wherein the modified fine adjustment input signal comprises the set of thermometer code.

7. The method of claim 6, wherein performing the fine adjustment to the coarse adjustment PWM output signal, using a high speed clock rate, based on the modified fine adjustment input signal, further comprises:
performing a bit shift using the set of thermometer code, to generate a bit-shifted fine adjustment signal; and
performing a logical OR operation or a logical AND operation using the coarse adjustment PWM output signal and the bit-shifted fine adjustment signal, to generate the increased resolution PWM output signal.

8. A system for generating a pulse width modulation (PWM) signal, the system comprising:
a system memory element;
a direct digital synthesis (DDS) digital-to-analog converter (DAC); and
at least one processor, communicatively coupled to the system memory element and the DDS DAC, the at least one processor configured to:
compute a coarse adjustment PWM output signal and a modified fine adjustment input signal, using a low speed clock rate, by:
receiving a data input vector, by the processor;
dividing the data input vector into a coarse adjustment input signal and a fine adjustment input signal; and
performing comparator operations and incrementing counter operations using the coarse adjustment input signal, to produce the coarse adjustment PWM output signal;
perform a fine adjustment to the coarse adjustment PWM output signal, using a high speed clock rate, based on the modified fine adjustment input signal; and
generate an increased resolution PWM output signal, via the DDS DAC, based on the fine adjustment.

9. The system of claim 8, wherein the at least one processor is configured to compute the coarse adjustment PWM output signal and the modified fine adjustment input signal, using a low speed clock rate, by:

modifying the fine adjustment input signal to generate the modified fine adjustment input signal, by translating the fine adjustment input signal into a set of falling edge thermometer code comprising an increasing serial representation of ones (1s), wherein the modified fine adjustment input signal comprises the set of falling edge thermometer code.

10. The system of claim 8, wherein the at least one processor is configured to compute the coarse adjustment PWM output signal and the modified fine adjustment input signal, using a low speed clock rate, by:
modifying the fine adjustment input signal to generate the modified fine adjustment input signal, by translating the fine adjustment input signal into a set of rising edge thermometer code comprising an increasing serial representation of ones (1s), wherein the modified fine adjustment input signal comprises the set of rising edge thermometer code.

11. The system of claim 8, wherein the at least one processor is configured to perform the fine adjustment to the coarse adjustment PWM output signal, using a high speed clock rate, based on the modified fine adjustment input signal, by:
receiving the coarse adjustment PWM output signal and the modified fine adjustment input signal, wherein the coarse adjustment PWM output signal and the modified fine adjustment input signal were pre-computed using the low speed clock rate;
shifting one bit of the fine adjustment input signal by performing a logical right shift, to generate a bit-shifted fine adjustment signal; and
performing a logical OR operation using the coarse adjustment PWM output signal and the bit-shifted fine adjustment signal, to generate the increased resolution PWM output signal.

12. The system of claim 8, wherein the at least one processor is configured to perform the fine adjustment to the coarse adjustment PWM output signal, using a high speed clock rate, based on the modified fine adjustment input signal, by:
receiving the coarse adjustment PWM output signal and the modified fine adjustment input signal, wherein the coarse adjustment PWM output signal and the modified fine adjustment input signal were pre-computed using the low speed clock rate;
shifting one bit of the fine adjustment input signal by performing a logical left shift, to generate a bit-shifted fine adjustment signal; and
performing a logical OR operation using the coarse adjustment PWM output signal and the bit-shifted fine adjustment signal, to generate the increased resolution PWM output signal.

13. The system of claim 8, wherein the at least one processor is configured to compute the coarse adjustment PWM output signal and the modified fine adjustment input signal, using a low speed clock rate, by:
performing typical PWM generator operations using the coarse adjustment input signal, to produce the coarse adjustment PWM output signal;
modifying the fine adjustment input signal to generate the modified fine adjustment input signal, by translating the fine adjustment input signal into a set of thermometer code comprising an increasing serial representation of ones (1s), wherein the modified fine adjustment input signal comprises the set of falling edge thermometer code.

14. The system of claim 13, wherein the at least one processor is configured to perform the fine adjustment to the coarse adjustment PWM output signal, using a high speed clock rate, based on the modified fine adjustment input signal, by:
performing a bit shift using the set of thermometer code, to generate a bit-shifted fine adjustment signal; and
performing a logical OR operation or a logical AND operation using the coarse adjustment PWM output signal and the bit-shifted fine adjustment signal, to generate the increased resolution PWM output signal.

15. A non-transitory, computer-readable medium containing instructions thereon, which, when executed by a processor, perform a method for generating a pulse width modulation (PWM) signal, the method comprising:
computing, by the processor, a coarse adjustment PWM output signal and a modified fine adjustment input signal, using a low speed clock rate, by:
receiving a data input vector, by the processor;
dividing the data input vector into a coarse adjustment input signal and a fine adjustment input signal;
performing typical PWM generator operations using the coarse adjustment input signal, to produce the coarse adjustment PWM output signal; and
modifying the fine adjustment input signal to generate the modified fine adjustment input signal, by translating the fine adjustment input signal into a set of thermometer code comprising an increasing serial representation of ones (1s), wherein the modified fine adjustment input signal comprises the set of falling edge thermometer code; and
wherein performing the fine adjustment to the coarse adjustment PWM output signal, using a high speed clock rate, based on the modified fine adjustment input signal, further comprises:
receiving the set of thermometer code and the coarse adjustment PWM output signal;
performing a bit shift using the set of thermometer code, to generate a bit-shifted fine adjustment signal; and
performing a logical OR operation or a logical AND operation using the coarse adjustment PWM output signal and the bit-shifted fine adjustment signal, to generate an increased resolution PWM output signal;
performing, by the processor, a fine adjustment to the coarse adjustment PWM output signal, using a high speed clock rate, based on the modified fine adjustment input signal; and
generating the increased resolution PWM output signal, by the processor, based on the fine adjustment.

16. The non-transitory, computer-readable medium of claim 15, further comprising:
adjusting rising edges of pulses of an original PWM output signal, using the coarse adjustment PWM output signal, the modified fine adjustment input signal, and the fine adjustment, to create adjusted rising edges;
wherein the increased resolution PWM output signal includes the adjusted rising edges.

17. The non-transitory, computer-readable medium of claim 15, further comprising:
adjusting falling edges of pulses of an original PWM output signal, using the coarse adjustment PWM output signal, the modified fine adjustment input signal, and the fine adjustment, to create adjusted falling edges;

wherein the increased resolution PWM output signal includes the adjusted falling edges.

* * * * *